United States Patent [19]

Akiyama et al.

[11] 3,864,174

[45] Feb. 4, 1975

[54] METHOD FOR MANUFACTURING SEMICONDUCTOR DEVICE

[76] Inventors: Nobuyuki Akiyama, No. 2612, Shinomiya, Hiratsuka-shi, Kanagawa-ken; Shunji Miura, No. 18-1, Takada 1-chome, Toshima-ku, Tokyo; Haruo Chisaka, No. 25-5, Misono 3-chome, Sagamihara-shi Kanagawa-ken, all of Japan

[22] Filed: Jan. 22, 1973

[21] Appl. No.: 325,745

[52] U.S. Cl. .................. 148/1.5, 148/175, 148/188, 357/91

[51] Int. Cl. .............................................. H01l 7/54

[58] Field of Search ...................... 148/1.5, 188, 175

[56] References Cited

UNITED STATES PATENTS

| | | | |
|---|---|---|---|
| 3,272,661 | 9/1966 | Tomono et al. | 148/1.5 |
| 3,290,189 | 12/1966 | Migitaka et al. | 148/188 |
| 3,458,368 | 7/1969 | Haberecht | 148/175 |
| 3,533,857 | 10/1970 | Mayer et al. | 148/1.5 |
| 3,600,797 | 8/1971 | Bower et al. | 148/1.5 X |

*Primary Examiner*—C. Lovell
*Assistant Examiner*—J. M. Davis
*Attorney, Agent, or Firm*—Larson, Taylor and Hinds

[57] ABSTRACT

A method for manufacturing semiconductor devices characterized in that a semiconductor element is fabricated, lifetime killers are introduced into the element by diffusion or like, and the element is thereafter subjected to an irradiation of electrons of an energy ranging from 0.1 to 5.0 Mev.

3 Claims, 2 Drawing Figures

METHOD FOR MANUFACTURING SEMICONDUCTOR DEVICE

DETAILED DESCRIPTION OF THE INVENTION

Figure 1:
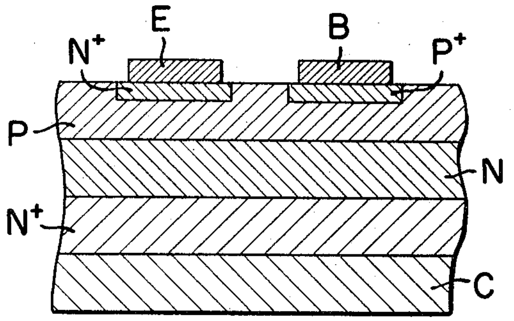

Minority carriers in semiconductor devices are playing an important part for the operational characteristics of these devices. More particularly, lifetime of the minority carriers (hereinafter referred to simply as "lifetime") affects all of the characteristics of the semiconductor devices, such as frequency characteristics, switching characteristics, amplification factors, and power losses in high-power devices.

Within the past 10 years, the technique for manufacturing semiconductor devices has made epoch-making progresses in various fields thereof. However, the technique relating to the control of "lifetime" has been much in retard because of the difficulties in controlling traces of deep level impurities and because reliable measuring methods for the extremely minute amounts of such impurities have not fully developed.

In ordinary case, oxygen in a range of $10^{14}$–$10^{18}$/cm$^3$ and carbon in a range of $10^{15}$–$8\times10^{17}$/cm$^3$ are contained in a silicon crystal. For controlling the "lifetime," gold (Au) element is widely used as a diffusion source. However, the gold elements tend to react with the oxygen and carbon in much complicated manner. Furthermore, the gold elements have a tendency to interact with lattice irregularities, such as dislocations and various kinds of point defects in the crystal lattices. Since many of the problems related to the "lifetime," such as the problem of interaction with the impurities and lattice irregularities, have not yet solved, the control of the "lifetime" cannot be carried out satisfactorily.

In addition to the above described difficulties, according to our experiments, the lifetime is widely varied depending on the conditions of the crystal and the hystories of the thermal treatment relating to temperatures, times, and cooling conditions of the thermal treatment (if necessary, refer to our report submitted to 18th Associated Meeting of Japanese Applied Physics held in April, 1971). The experimental results reveal that the lifetime is varied depending on various factors, and the control thereof is extremely difficult.

A Japanese Patent Application No. 74606/1971 entitled "Production of Semiconductor Silicon devices" discloses a technique of heat-treating the semiconductor Silicon at 750°C for recovering the lifetime. Such a recovery of lifetime is considered to be based on an interaction between the lifetime killers and impurities. However, the true reason has not yet clarified because of the complexity of the phenomenon and the difficulty in handling the extremely minute amounts of the impurities.

As in this example, because of the extremely minute amounts of the impurities and the dirt being too difficult to be controlled, and of the interaction thereof with the lattice irregularities in the crystal, the control of the lifetime of the device has been heretofore attempted rather empirically than theoretically.

As is described hereinbefore, a metal preferably gold is advantageously used for improving the switching characteristics, frequency characteristics, and the amplifying factors of the semiconductor devices, simultaneously. However, controlling the metal elements so that the elements are introduced into threedimensional positions in the blank for acting as the active centers is not easy. The principal reasons thereof reside in that there exists an interaction (gettering) between the metal elements and the oxide layer on the surface of the blank of the semiconductor device, or between the metal elements and other impurities or lattice defects, whereby the amount of the metal elements and the number of the active centers formed by a part of the metal impurities are varied. For the rectification of such reasons in a blanced manner, mere diffusion of the metal elements is not sufficient, and there exists a limitation in the improvement of the operational characteristics of the semiconductor device.

The object of the present invention is to provide a method for effectively controlling the active center in the semiconductor devices so that the operational characteristics of these devices thus obtained can be improved in a well blanced manner. More specifically, the method is characterized in that a semiconductor element is fabricated, lifetime killers are introduced into the element by diffusion or the like, and the element is thereafter subjected to an irradiation of electrons of an energy ranging from 0.1 to 5.0 Mev.

According to the present invention, firstly $N^+$ diffusion and $P^+$ diffusion of ordinary types are repeatedly practiced on the semiconductor element so that the fundamental function of the semiconductor device is thereby realized. A metal element is thereafter introduced into the semiconductor element, for instance, by diffusion, and the element is subjected to an irradiation of electrons, with the accelerating voltage or current being controlled suitably so that the electrons may reach into a desired depth of the semiconductor element, and with the irradiation being localized to suitable positions in the surface of the semiconductor element by the use of, for instance, a suitable masking plate, so that the lifetime of the operationally required positions can be thereby controlled.

It is publicly known that the lifetime can be reduced by the irradiation of accelerated particles such as electrons. However, when the irradiation of particles is applied to the production of semiconductor devices, it is essential that the problems, such as the influence of the irradiation to the other operational characteristics of the devices, the variation of the characteristics during an elapse of time, and the operational stability at the rated temperature, must be solved prior to the application.

General application of the irradiation to the production of semiconductor devices has not yet recognized as a common practice because the problems of the variation with time of the characteristics and the stable operation of device at the rated temperature have not yet solved. The lifetime killers caused by the irradiation are considered to be mostly point defects (or groups of point defects) of lattice which are caused an extinction and movement in the semiconductor under thermal effect or under the influence of the high electric field. Most of these phenomena are not yet theoretically clarified.

According to the present invention, electrons selected in the range of 0.1 to 5 Mev in accordance with the desired characteristics and objectives are irradiated on a semiconductor device wherein a metallic element has been introduced, thereby to utilize the metallic element effectively.

Our experiments reveal that the irradiation of electrons of the energy selected from the above-mentioned range causes no harmful effect on the semiconductor device, and the operational characteristics of the device are improved and their stability at the rated temperature can be maintained satisfactorily. Furthermore, the semiconductor device thus irradiated by the electrons has suffered substantially no variation after a considerably long period of operation, whereby the effectiveness of the irradiation has been assured.

The invention will be more clearly understood from the following detailed description of the invention when read in conjunction with the accompanying drawing.

Figure 2:
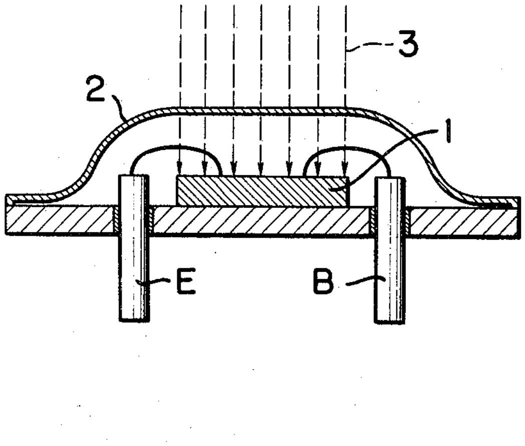

FIG. 1 is a cross-sectional view of a transistor, wherein E designates the emitter, B the base, C the collector, and $N^+$, P, $P^+$ designate respectively conductivity types obtained by diffusion of impurities; and FIG. 2 shows an example wherein electron beams 3 are irradiated from outside of an capsule 2 onto a transistor 1 encased in the capsule 2.

Referring to FIG. 1, there is indicated a transistor which is made in such a manner that an N-type silicon water is undergone through $N^+$ (phos) diffusion, one of the surface is thereafter lapped and then polished into a mirror surface, undergone through P(Boron) diffusion, and then treated by photo-etching so that emitter diffusion and base diffusion are therewith attained. The transistor thus produced was further diffused by gold, provided with electrodes, and encased in a metal capsule as shown in FIG. 2.

The operation characteristics of the transistor thus produced were measured, and the transistor was exposed to irradiation of electrons generated from Van de Graaff accelerator (under irradiating conditions of 1.2 Mev, $1\times10^{15}/cm^3$, and 0.8 Mev. on the surface of the semiconductor element). The transistor thus irradiated was thereafter heat-treated at 150°C for 200 hours. The characteristics of the transistor after each of the above described steps are shown in Table 1.

As will be apparent from Table 1, the operational characteristics based on the lifetime of the transistor can be controlled as desired by suitably irradiating the transistor by electron beams after the transistor has been subjected to the diffusion of gold, and thereafter removing unstable initial characteristics through heat treatment.

When the results obtained after the diffusion of gold is compared with the results obtained after the irradiation of electrons and the heat treatment, it will be apparent that the reduction of the d.c. current gain is not so severe as the minimization of the switching time. This means that the frequency characteristic is widely improved by the irradiation of electrons and by the heat treatment, such a fact constituting an important feature of this invention.

In Table 2, there are indicated results obtained after long time tests at rated temperature (150°C) conducted on a transistor which is subjected to a preliminary heat treatment of about 200 hours after the irradiation of electrons, and again heat treated at 150°C. From these results, it will be apparent that not only the reverse voltage of the transistor, but also the switching time and the d.c. current gain of the transistor were all held stable for the long times of the test.

As is apparent from the above described test results, the control of lifetime can be achieved by irradiating electrons of a suitable energy level on a transistor which has been subjected to the gold diffusions and by so controlling the lifetime, switching characteristics of a diode, thyristor, and the like can be substantially improved, and the frequency characteristics and current gain of various kinds of transistors can also be simultaneously improved. Furthermore, by the above described treatments, no harmful effects are caused on other characteristics of the semiconductor devices, and satisfactory results can be obtained on the characteristic variation with time and on the stability in the operation at the rated temperature.

For these reasons, advantageous features obtainable in practicing the invention are further assured.

TABLE 1

| | Reverse Voltage | | Switching time | Saturation Voltage | | D.C current gain |
|---|---|---|---|---|---|---|
| | VCBO | VCEO | toff | VBE | VCE | hFE Jc=2 amp. |
| After gold is diffused | $1260^{V}$ | $440^{V}$ | 5.1 μsec. | $1.37^{V}$ | $0.64^{V}$ | 44 |
| After electron rays are irradiated | 1260 | 440 | extremely short | 2.70 | 1.53 | very small |
| After heat-treated at 150°C for 200 H | 1260 | 440 | 0.8 | 2.11 | 1.32 | 13.7 |

TABLE 2

| | Reverse voltage | | Switching time | Saturation voltage | | D.C. current gain |
|---|---|---|---|---|---|---|
| | VCBO | VCEO | toff | VBE | BCE | hFE Ic=2 amp. |
| After preliminary heat treatment | $1260^{V}$ | $440^{V}$ | 0.8 μsec. | $2.11^{V}$ | $1.32^{V}$ | 13.7 |
| After heat treatment for 500 H | 1260 | 440 | 0.8 | 2.10 | 1.33 | 14.0 |
| After heat treatment for 1000 H | 1260 | 440 | 0.8 | 2.10 | 1.31 | 13.9 |
| After heat treatment for 3000 H | 1260 | 440 | 0.8 | 2.13 | 1.29 | 14.0 |

We claim:

1. A method for manufacturing semiconductor device characterized in that a semiconductor element is fabricated, lifetime killers are introduced into the element by diffusion or like, and the element is thereafter subjected to an irradiation of electrons of an energy ranging from 0.1 to 5.0 Mev.

2. A method as stated in claim 1, characterized in that the semiconductor element is subjected to an irradiation of electrons from outside of a capsule thereby the lifetime is controlled.

3. A method as stated in claim 1, characterized in that a masking pattern is placed on a semiconductor element and that the masking surface of said element is subjected to an irradiation of electrons thereby the positional control of the lifetime is carried out.

* * * * *